(12) United States Patent
Inoue et al.

(10) Patent No.: US 12,131,891 B2
(45) Date of Patent: Oct. 29, 2024

(54) WAFER PLACEMENT TABLE

(71) Applicant: NGK Insulators, Ltd., Nagoya (JP)

(72) Inventors: Seiya Inoue, Handa (JP); Tatsuya Kuno, Nagoya (JP)

(73) Assignee: NGK INSULATORS, LTD., Nagoya (JP)

(*) Notice: Subject to any disclaimer, the term of this patent is extended or adjusted under 35 U.S.C. 154(b) by 208 days.

(21) Appl. No.: 17/813,643

(22) Filed: Jul. 20, 2022

(65) Prior Publication Data

US 2023/0122013 A1 Apr. 20, 2023

(30) Foreign Application Priority Data

Oct. 14, 2021 (JP) .................................. 2021-168603

(51) Int. Cl.
*H01J 37/32* (2006.01)
*H01L 21/683* (2006.01)

(52) U.S. Cl.
CPC .... *H01J 37/32724* (2013.01); *H01L 21/6833* (2013.01); *H01J 2237/002* (2013.01); *H01J 2237/007* (2013.01); *H01J 2237/327* (2013.01)

(58) Field of Classification Search
CPC ......... H01L 21/68742; H01L 21/67069; H01L 21/6833; H01L 21/6875; H01L 21/67109; H01L 21/67213; H01J 37/32724; H01J 2237/002; H01J 2237/327; H01J 2237/007
USPC .......................................................... 361/234
See application file for complete search history.

(56) References Cited

U.S. PATENT DOCUMENTS

| 9,255,747 B2 | 2/2016 | Jindo et al. | |
| 9,257,315 B2 | 2/2016 | Jindo et al. | |
| 2008/0178608 A1* | 7/2008 | Tandou | F25B 39/02 62/515 |
| 2014/0202386 A1 | 7/2014 | Taga et al. | |
| 2014/0238609 A1* | 8/2014 | Tomioka | H01L 21/6875 279/128 |

(Continued)

FOREIGN PATENT DOCUMENTS

| JP | 2010-272873 A | 12/2010 |
| JP | 5462946 B2 | 4/2014 |

(Continued)

OTHER PUBLICATIONS

Machine translation of Kimbara et al. Japanese Patent Document JP 2020-53576 A Apr. 2020 (Year: 2020).*

(Continued)

*Primary Examiner* — Kevin J Comber
(74) *Attorney, Agent, or Firm* — BURR PATENT LAW, PLLC

(57) ABSTRACT

A wafer placement table includes a ceramic base having a wafer placement surface on its top surface where a wafer is able to be placed and incorporating an electrode, a cooling base bonded to a bottom surface of the ceramic base and having a refrigerant flow channel, a plurality of holes extending through the cooling base in an up and down direction, and a heat exchange promoting portion that is provided in an area around at least one of the plurality of holes and that promotes heat exchange between refrigerant flowing through the refrigerant flow channel and a wafer placed on the wafer placement surface.

6 Claims, 7 Drawing Sheets

(56) References Cited

U.S. PATENT DOCUMENTS

| | | |
|---|---|---|
| 2016/0307787 A1 | 10/2016 | Uemura et al. |
| 2018/0261486 A1 | 9/2018 | Anada et al. |
| 2020/0286755 A1* | 9/2020 | Ito .................... H01L 21/67109 |
| 2020/0402775 A1 | 12/2020 | Hayasaka et al. |
| 2021/0043433 A1 | 2/2021 | Koizumi et al. |
| 2021/0057237 A1 | 2/2021 | Ezaki et al. |

FOREIGN PATENT DOCUMENTS

| | | |
|---|---|---|
| JP | 2014-160790 A | 9/2014 |
| JP | 5666748 B1 | 2/2015 |
| JP | 5666749 B1 | 2/2015 |
| JP | 2016-115933 A | 6/2016 |
| JP | 2016-207777 A | 12/2016 |
| JP | 2017-201669 A | 11/2017 |
| JP | 2020053576 A * | 4/2020 |
| JP | 2020-145238 A | 9/2020 |
| JP | 2021-028960 A | 2/2021 |
| KR | 10-2014-0108141 A | 9/2014 |
| KR | 10-2021-0018145 A | 2/2021 |
| TW | 202111852 A | 3/2021 |
| TW | 202129752 A | 8/2021 |

OTHER PUBLICATIONS

Japanese Notification of Third Party Submission (Application No. 2021-168603) dated Oct. 24, 2023 (with English translation) (5 pages).

Japanese Notification of Third Party Submission (Application No. 2021-168603) dated Oct. 24, 2023 (with English translation) (4 pages).

Taiwanese Office Action (Application No. 111129659) dated Jun. 6, 2023 (6 pages).

Japanese Office Action (with English translation) dated May 21, 2024 (Application No. 2021-168603).

Korean Office Action (with English translation) dated May 20, 2024 (Application No. 10-2022-0090810).

* cited by examiner

WAFER PLACEMENT TABLE

BACKGROUND OF THE INVENTION

1. Field of the Invention

The present invention relates to a wafer placement table.

2. Description of the Related Art

Hitherto, there is known a wafer placement table that includes a ceramic base having a wafer placement surface and incorporating an electrode, a cooling base having a refrigerant flow channel, and a bonding layer bonding the ceramic base with the cooling base. For example, Patent Literatures 1 and 2 describe that, in such a wafer placement table, the cooling base made of a metal matrix composite material of which the coefficient of linear thermal expansion is substantially the same as that of the ceramic base is used. Patent Literatures 1 and 2 also describe that the wafer placement table has a terminal hole for allowing insertion of a power supply terminal for supplying electric power to an electrode, gas holes for supplying He gas to the back surface of a wafer, and lift pin holes for allowing insertion of lift pins to lift a wafer from the wafer placement surface.

CITATION LIST

Patent Literature

PTL 1: JP 5666748 B
PTL 2: JP 5666749 B

SUMMARY OF THE INVENTION

However, heat dissipation performance is low around the terminal hole, the gas holes, and the lift pin holes, so an area around just above each of those holes in a wafer can be so-called hot spot where the temperature is higher than the other part.

The present invention is made to solve such a problem, and it is a main object to reduce occurrence of hot spots in a wafer.

A wafer placement table of the present invention includes a ceramic base having a wafer placement surface on its top surface where a wafer is able to be placed and incorporating an electrode, a cooling base bonded to a bottom surface of the ceramic base and having a refrigerant flow channel, a plurality of holes extending through the cooling base in an up and down direction, and a heat exchange promoting portion that is provided in an area around at least one of the plurality of holes and that promotes heat exchange between refrigerant flowing through the refrigerant flow channel and a wafer placed on the wafer placement surface.

In the wafer placement table, the heat exchange promoting portion that is provided in an area around at least one of the plurality of holes and that promotes heat exchange between refrigerant flowing through the refrigerant flow channel and a wafer placed on the wafer placement surface. Generally, an area around just above such a hole in a wafer tends to be a hot spot; however, the heat exchange promoting portion is provided in an area around such a hole in the present invention, so heat dissipation of the area around the hole is promoted. Therefore, it is possible to reduce occurrence of a hot spot in a wafer.

In the wafer placement table of the present invention, the refrigerant flow channel in the heat exchange promoting portion may be narrower than the refrigerant flow channel in an area outside the area around the hole. Refrigerant flowing through a part where the refrigerant flow channel is narrow flows at a higher flow rate than refrigerant flowing through a part where the refrigerant flow channel is not narrow. Therefore, heat dissipation of the area around the hole is promoted. For example, when the refrigerant flow channel is viewed in plan, the width of the refrigerant flow channel in the heat exchange promoting portion may be narrower than the width of the refrigerant flow channel in the area outside the area around the hole. The flow channel cross-sectional area of the part where the refrigerant flow channel is narrow is preferably 60% to 90% of the flow channel cross-sectional area of the part where the refrigerant flow channel is not narrow.

In the wafer placement table of the present invention, in the heat exchange promoting portion, a fin may be provided on an inner surface of the refrigerant flow channel. Refrigerant flowing through the part of the refrigerant flow channel where the fin is provided is more likely to be turbulent flow than refrigerant flowing through the part of the refrigerant flow channel where no fin is provided. Therefore, heat dissipation of the area around the hole is promoted. The flow channel cross-sectional area of the part of the refrigerant flow channel where the fin is provided is preferably 60% to 90% of the flow channel cross-sectional area of the part of the refrigerant flow channel where no fin is provided.

In the wafer placement table of the present invention, a distance from the wafer to a ceiling surface of the refrigerant flow channel in the heat exchange promoting portion may be shorter than the distance in an area outside the area around the hole. The thermal resistance of refrigerant flowing through the part where the distance from a wafer to the ceiling surface of the refrigerant flow channel is short is smaller than the thermal resistance of refrigerant flowing through the part where the distance from the wafer to the ceiling surface of the refrigerant flow channel is not short. Therefore, heat dissipation of the area around the hole is promoted. The distance from the wafer to the ceiling surface of the refrigerant flow channel in the heat exchange promoting portion is preferably 50% to 90% of the distance from the wafer, other than the heat exchange promoting portion, to the ceiling surface of the refrigerant flow channel.

The wafer placement table of the present invention may further include a plurality of small projections that is provided on a reference surface of the wafer placement surface and that supports a bottom surface of a wafer with top faces, the top faces of the plurality of small projections may be in the same plane, and a coverage factor of the small projections in the heat exchange promoting portion may be higher than the coverage factor in an area outside the area around the hole or the reference surface in the heat exchange promoting portion may be raised as compared to the area outside the area around the hole. The "coverage factor of small projections" is the ratio of the total area of the top faces of small projections to a unit area. The small projections are made of ceramics. Ceramics are higher in thermal conductivity than an air gap. The ratio of ceramics in a plane direction in a part where the coverage factor of small projections is high is higher than the ratio of ceramics in the plane direction in a part where the coverage factor of small projections is not high, so heat exchange between a wafer and refrigerant is promoted, and heat dissipation is promoted. The coverage factor of small projections present within a radius of 25 mm from the center of the hole is preferably higher than or equal to twice as high as the coverage factor of small projections in the other place. The thickness of an air gap between the reference surface and the wafer in a part where the reference surface is raised is less than the thickness of the air gap in a part where the reference surface is not raised. The ratio of ceramics in a thickness direction in a part where the reference surface is raised is higher than the ratio of ceramics in the thickness direction in a part where the reference surface is not raised, so heat exchange between the wafer and refrigerant is promoted, and heat dissipation is promoted. A coverage factor of the small projections in the heat exchange promoting portion may be higher than the coverage factor in an area outside the area around the hole, and the reference surface in the heat exchange promoting portion may be raised as compared to the area outside the area around the hole.

In the wafer placement table of the present invention, the hole may be at least one selected from the group of a power supply member insertion hole that is provided to extend downward from the electrode in the wafer placement table and through which a power supply member that supplies electric power to the electrode is inserted, a lift pin hole that extends through the wafer placement table in the up and down direction and through which a lift pin is inserted, and a gas hole that extends through the wafer placement table in the up and down direction and through which gas is supplied to the wafer placement surface. Generally, an area just above each of a power supply member insertion hole, a lift pin hole, and a gas hole in a wafer tends to be a hot spot. Therefore, the significance to apply the present invention is high.

BRIEF DESCRIPTION OF THE DRAWINGS

FIG. 9 is an enlarged sectional view showing a relevant part of another example of a wafer placement surface 22a.

FIGS. 11A to 11D are plan views showing a relevant part of another example of the wafer placement surface 22a.

DETAILED DESCRIPTION OF THE INVENTION

Figure 1:
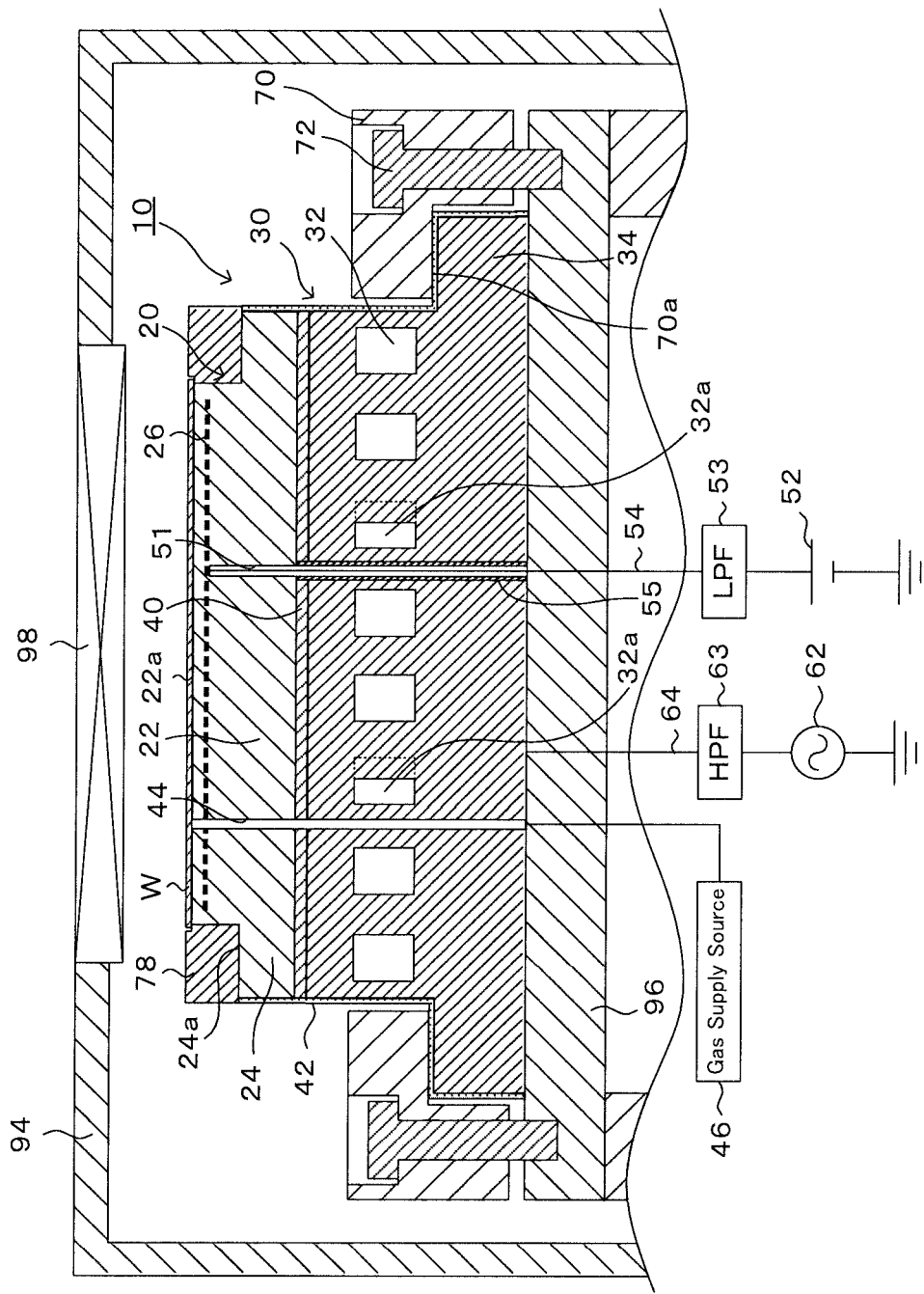
FIG. 1 is a profile of a wafer placement table 10 placed in a chamber 94.
Figure 2:
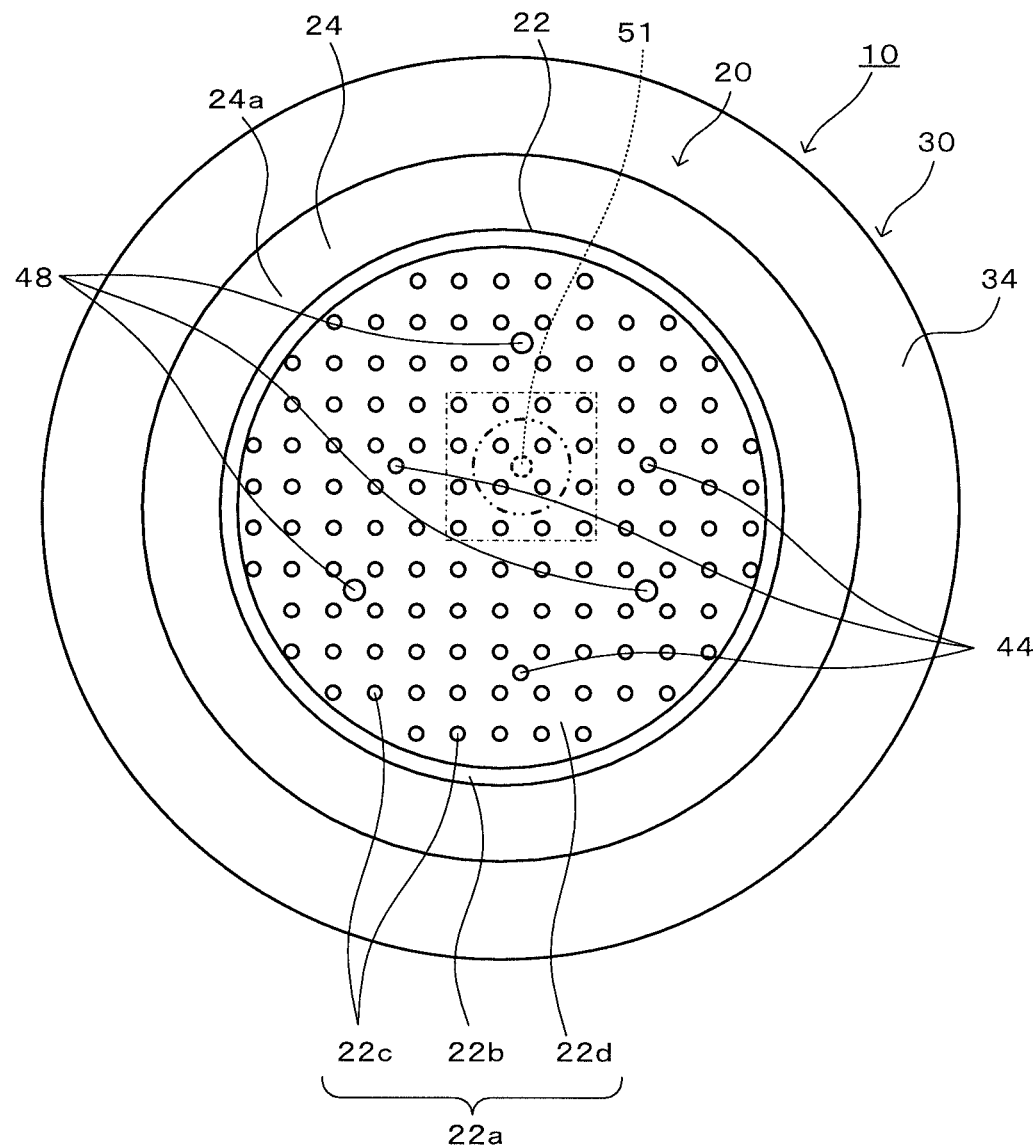
FIG. 2 is a plan view of the wafer placement table 10.
Figure 3:
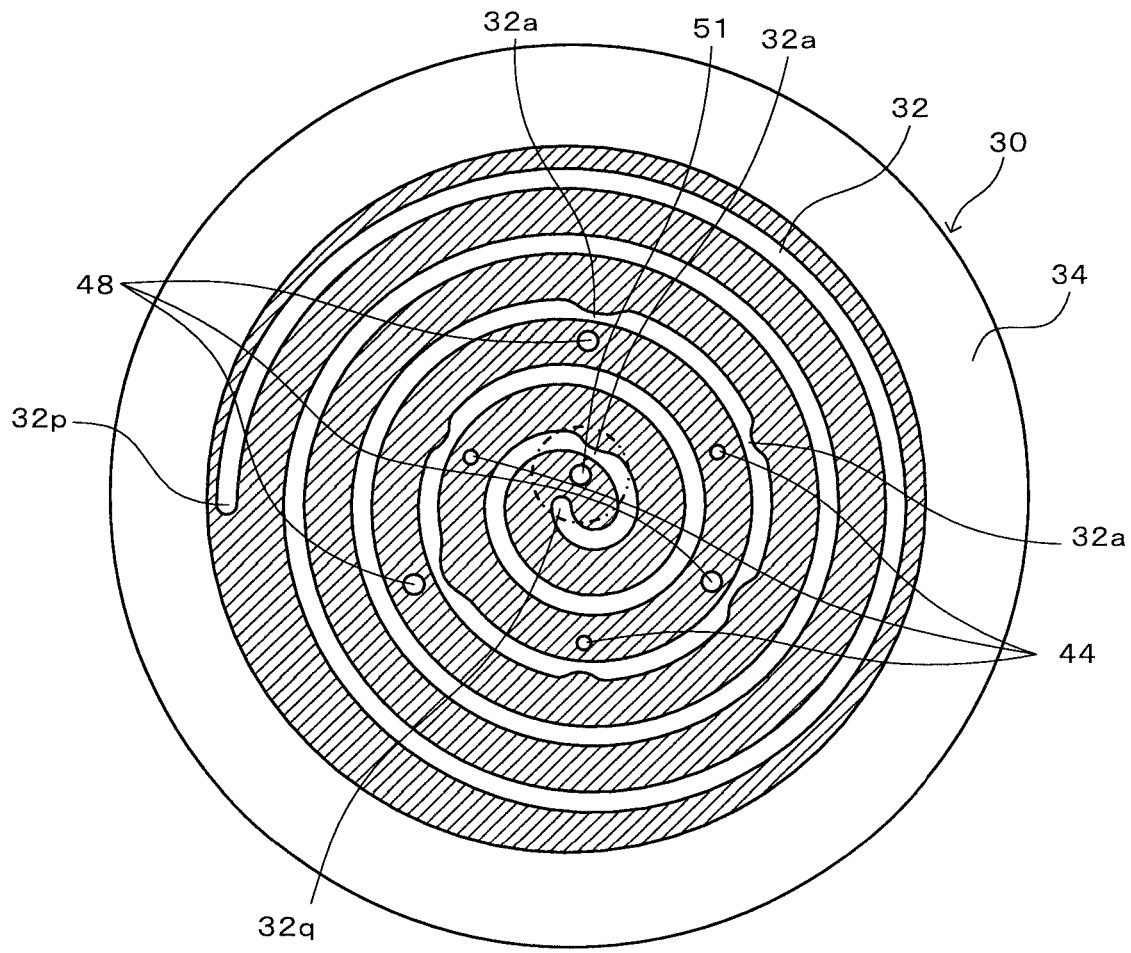
FIG. 3 is a sectional view of the wafer placement table 10, taken along a horizontal plane passing through a refrigerant flow channel 32.
Figure 4:
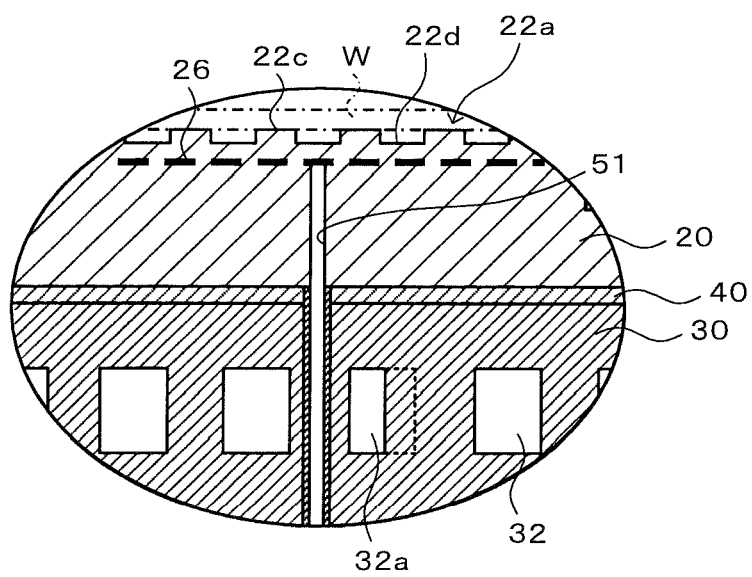
FIG. 4 is an enlarged sectional view showing a relevant part of the refrigerant flow channel 32.

A preferred embodiment of the present invention will be described below with reference to the drawings. FIG. 1 is a profile of a wafer placement table 10 placed in a chamber 94 (a sectional view taken along a plane including the central axis of the wafer placement table 10), FIG. 2 is a plan view of the wafer placement table 10, FIG. 3 is a sectional view of the wafer placement table 10, taken along a horizontal plane passing through a refrigerant flow channel 32, and FIG. 4 is an enlarged sectional view showing a relevant part of the refrigerant flow channel 32.

The wafer placement table 10 is used to perform CVD, etching, or the like on a wafer W by using plasma, and is fixed to a mounting plate 96 provided inside a semiconductor process chamber 94. The wafer placement table 10 includes a ceramic base 20, a cooling base 30, and a metal bonding layer 40.

The ceramic base 20 includes an outer peripheral part 24 having an annular focus ring placement surface 24a, on the outer peripheral side of a central part 22 having a circular wafer placement surface 22a. Hereinafter, a focus ring may be abbreviated as "FR". A wafer W is placed on the wafer placement surface 22a, and a focus ring 78 is placed on the FR placement surface 24a. The ceramic base 20 is made of a ceramic material, typically, alumina, aluminum nitride, or the like. The FR placement surface 24a is lower in level than the wafer placement surface 22a.

The central part 22 of the ceramic base 20 incorporates a wafer attraction electrode 26 on the side close to the wafer placement surface 22a. The wafer attraction electrode 26 is made of a material that contains, for example, W, Mo, WC, MoC, or the like. The wafer attraction electrode 26 is a disk-shaped or mesh-shaped single-pole electrostatic attraction electrode. A layer of the ceramic base 20 on the upper side of the wafer attraction electrode 26 functions as a dielectric layer. A wafer attraction direct current power supply 52 is connected to the wafer attraction electrode 26 via a power supply terminal 54 (which corresponds to the power supply member of the present invention). The power supply terminal 54 is inserted through a terminal hole 51 provided between the bottom surface of the wafer attraction electrode 26 and the bottom surface of the cooling base 30 in the wafer placement table 10. The power supply terminal 54 is provided so as to pass through an electrically insulating tube 55 disposed in a through-hole extending through the cooling base 30 and the metal bonding layer 40 in the up and down direction in the terminal hole 51 and reach the wafer attraction electrode 26 from the bottom surface of the ceramic base 20. A low pass filter (LPF) 53 is provided between the wafer attraction direct current power supply 52 and the wafer attraction electrode 26.

As shown in FIG. 2, on the wafer placement surface 22a, a seal band 22b is formed along the outer edge, and a plurality of small projections 22c is formed all over the surface. The seal band 22b and the plurality of small projections 22c are formed on a reference surface 22d of the wafer placement surface 22a. The small projections 22c are flat cylindrical projections in the present embodiment. The top face of the seal band 22b and the top faces of the plurality of small projections 22c are located in the same plane. The height of each of the seal band 22b and the small projections 22c (that is, a distance from the reference surface 22d to each of these top faces) is several micrometers to several tens of micrometers. A wafer W is placed on the wafer placement surface 22a in a state of being in contact with the top face of the seal band 22b and the top faces of the plurality of small projections 22c.

The cooling base 30 is a disk member made of a metal matrix composite material (also referred to as metal matrix composite (MMC)). The cooling base 30 has the refrigerant flow channel 32 in which refrigerant is able to circulate. The refrigerant flow channel 32 is connected to a refrigerant supply passage and a refrigerant discharge passage (not shown), and refrigerant discharged from the refrigerant discharge passage is adjusted in temperature and then returned to the refrigerant supply passage again. Examples of the MMC include a material including Si, SiC, and Ti, and a material obtained by impregnating an SiC porous body with Al and/or Si. The material including Si, Sic, and Ti is referred to as SisiCTi, the material that impregnates an SiC porous body with Al is referred to as AlsiC, and the material that impregnates an SiC porous body with Si is referred to as SisiC. When the ceramic base 20 is an alumina base, the MMC used for the cooling base 30 is preferably AlSiC, SisiCTi, or the like of which the coefficient of thermal expansion is close to the coefficient of thermal expansion of alumina. The cooling base 30 is connected to an RF power supply 62 via a power supply terminal 64. A high pass filter (HPF) 63 is disposed between the cooling base 30 and the RF power supply 62. The cooling base 30 has a flange 34 on the bottom surface side. The flange 34 is used to clamp the wafer placement table 10 to a mounting plate 96.

The metal bonding layer 40 bonds the bottom surface of the ceramic base 20 with the top surface of the cooling base 30. The metal bonding layer 40 may be, for example, a layer made of solder or a brazing metal material. The metal bonding layer 40 is formed by, for example, TCB (thermal compression bonding). TCB is a known method of sandwiching a metal bonding material between two members to be bonded and bonding the two members in a state of being heated to a temperature lower than or equal to a solidus temperature of the metal bonding material.

The side surface of the outer peripheral part 24 of the ceramic base 20, the outer periphery of the metal bonding layer 40, and the side surface of the cooling base 30 are coated with an electrically insulating film 42. Examples of the electrically insulating film 42 include a sprayed film made of alumina, yttria, or the like.

The wafer placement table 10 has a plurality of holes that extend through the wafer placement table 10 in the up and down direction. As shown in FIG. 2, such holes include a plurality of gas holes 44 that open at the reference surface 22*d* of the wafer placement surface 22*a* and lift pin holes 48 for allowing insertion of lift pins used to raise and lower the wafer W with respect to the wafer placement surface 22*a*. The plurality of (three in the present embodiment) gas holes 44 is provided at adequate locations on the reference surface 22*d* when the wafer placement surface 22*a* is viewed in plan. Heat transfer gas, such as He gas, is supplied from an external gas supply source 46 (see FIG. 1) to the gas holes 44. When heat transfer gas is supplied to the gas holes 44 in a state where the wafer W is placed on the wafer placement surface 22*a*, a space surrounded by the wafer W, the seal band 22*b*, the small projections 22*c*, and the reference surface 22*d* is filled with heat transfer gas. Since heat transfer gas is higher in thermal conductivity than vacuum, heat transfer gas plays a role in increasing heat transfer between the wafer W and the ceramic base 20. The plurality of (three in the present embodiment) lift pin holes 48 is provided at equal intervals along the concentric circle of the wafer placement surface 22*a* when the wafer placement surface 22*a* is viewed in plan.

As shown in FIG. 3, the refrigerant flow channel 32 provided inside the cooling base 30 is formed in a one-stroke pattern from an inlet 32*p* to an outlet 32*q* over the entire area other than the flange 34 in the cooling base 30 when the cross section of the refrigerant flow channel 32, taken along the horizontal plane, is viewed from above. In the present embodiment, the refrigerant flow channel 32 is formed in a spiral shape. In the refrigerant flow channel 32, parts 32*a* respectively passing through an area around the terminal hole 51 (the area surrounded by the alternate long and two short dashes line in FIGS. 2 and 3), an area around each of the gas holes 44, and an area around each of the lift pin holes 48 are formed so as to be narrower in width (a flow channel is narrower) than a part other than the areas respectively around these holes. In other words, in the refrigerant flow channel 32, the flow channel cross-sectional area of each of these parts 32*a* is smaller than the flow channel cross-sectional area of the other part. Therefore, in the refrigerant flow channel 32, refrigerant flowing through these parts 32*a* flows at a higher flow rate than refrigerant flowing through the other part. The parts 32*a* of the refrigerant flow channel 32 correspond to the heat exchange promoting portion of the present invention. The refrigerant flow channel 32 passes on both right and left sides of each of these holes 51, 44, 48, and, in the present embodiment, one side of each of the holes 51, 44, 48 is narrowed.

The thus configured wafer placement table 10 is attached to the mounting plate 96 inside the chamber 94 by using a clamp member 70. The clamp member 70 is an annular member with a substantially inverted L-shaped cross section and has an inner peripheral step surface 70*a*. The wafer placement table 10 and the mounting plate 96 are united by the clamp member 70. In a state where the inner peripheral step surface 70*a* of the clamp member 70 is placed on the flange 34 of the cooling base 30 of the wafer placement table 10, bolts 72 are inserted from the top surface of the clamp member 70 and screwed to threaded holes provided on the top surface of the mounting plate 96. The bolts 72 are inserted at multiple locations (for example, eight locations or 12 locations) provided at equal intervals along the circumferential direction of the clamp member 70. The clamp member 70 and the bolts 72 may be made of an electrically insulating material or may be made of an electrically conductive material (metal or the like).

Figure 5:
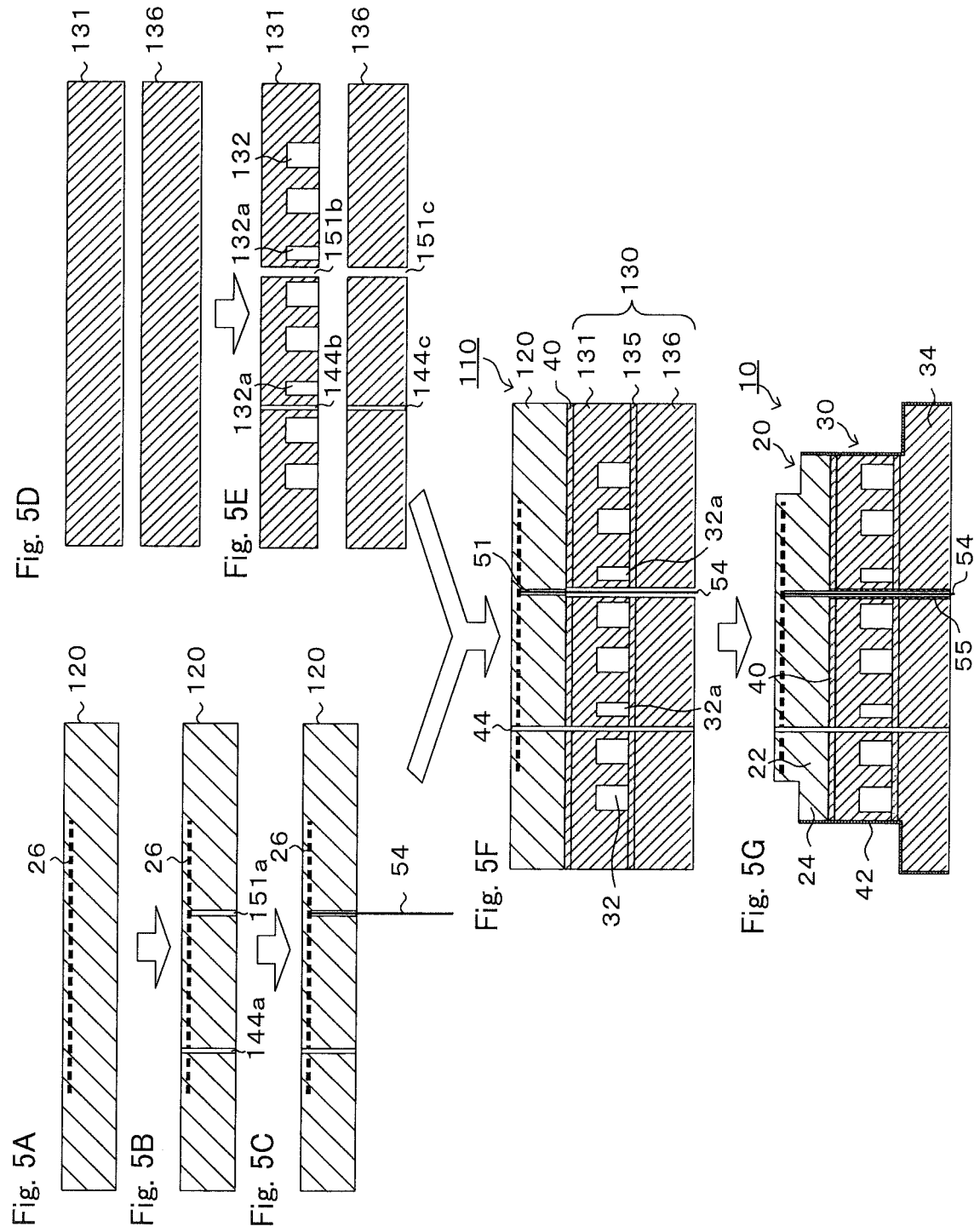
FIGS. 5A to 5G are manufacturing process charts of the wafer placement table 10.

Next, an example of manufacturing of the wafer placement table 10 will be described with reference to FIGS. 5A to 5G. FIGS. 5A to 5G are manufacturing process charts of the wafer placement table 10. Initially, a disk-shaped ceramic sintered body 120 that is the source of the ceramic base 20 is made by firing a ceramic powder molded body by hot pressing (FIG. 5A). The ceramic sintered body 120 incorporates the wafer attraction electrode 26. Subsequently, a terminal hole upper part 151*a* is formed from the bottom surface of the ceramic sintered body 120 to the wafer attraction electrode 26, and gas hole upper parts 144*a* and lift pin hole upper parts (not shown) extending through the ceramic sintered body 120 in the up and down direction are perforated at predetermined locations (FIG. 5B). Then, the power supply terminal 54 is inserted into the terminal hole upper part 151*a*, and the power supply terminal 54 and the wafer attraction electrode 26 are bonded (FIG. 5C).

In parallel with this, two MMC disk members 131, 136 are made (FIG. 5D). Then, a plurality of holes extending through both the MMC disk members 131, 136 in the up and down direction is perforated, and a groove 132 that will be finally the refrigerant flow channel 32 is formed on the bottom surface of the upper-side MMC disk member 131 (FIG. 5E). Specifically, a terminal hole middle part 151*b*, gas hole middle parts 144*b*, and lift pin hole middle parts (not shown) are perforated in the upper-side MMC disk member 131. In addition, a terminal hole lower part 151*c*, gas hole lower parts 144*c*, and lift pin hole lower parts (not shown) are perforated in the lower-side MMC disk member 136. The groove width of each of parts 132*a* corresponding to the parts 32*a* where the width of the refrigerant flow channel 32 is narrow in the groove 132 is narrowed. When the ceramic sintered body 120 is made of alumina, the MMC disk members 131, 136 are preferably made of SisiCTi or AlsiC.

This is because the coefficient of thermal expansion of alumina and the coefficient of thermal expansion of SiSiCTi or AlsiC are almost the same.

The disk member made of SisiCTi can be made by, for example, as follows. Initially, a powder mixture is made by mixing silicon carbide, metal Si and metal Ti. After that, a disk-shaped molded body is made by uniaxial pressing of the obtained powder mixture, and the molded body is sintered by hot pressing in an inert atmosphere, with the result that the disk member made of SiSiCTi is obtained.

Subsequently, a metal bonding material is disposed between the bottom surface of the upper-side MMC disk member 131 and the top surface of the lower-side MMC disk member 136, and a metal bonding material is disposed on the top surface of the upper-side MMC disk member 131. Through-holes are provided in advance in each of the metal bonding materials at locations facing the holes. The power supply terminal 54 of the ceramic sintered body 120 is inserted into the terminal hole middle part 151*b* and the terminal hole lower part 151*c*, and the ceramic sintered body 120 is placed on the metal bonding material disposed on the top surface of the MMC disk member 131. Thus, a laminated body in which the lower-side MMC disk member 136, the metal bonding material, the upper-side MMC disk member 131, the metal bonding material, and the ceramic sintered body 120 are laminated in this order from the bottom is obtained. By pressurizing the laminated body while heating the laminated body (TCB), a bonded body 110 is obtained (FIG. 5F). The bonded body 110 is configured such that the ceramic sintered body 120 is bonded via the metal bonding layer 40 to the top surface of the MMC block 130 that is the source of the cooling base 30. The MMC block 130 is the one in which the upper-side MMC disk member 131 and the lower-side MMC disk member 136 are bonded via a metal bonding layer 135. The MMC block 130 has the refrigerant flow channel 32, the terminal hole 51, the gas holes 44, and the lift pin holes (not shown) inside. The width of each of the parts 32*a* passing through the areas respectively around the holes in the refrigerant flow channel 32 is narrowed. The terminal hole 51 is a hole made up of the continuous terminal hole upper part 151*a*, terminal hole middle part 151*b*, and terminal hole lower part 151*c*. Each gas hole 44 is a hole made up of the continuous gas hole upper part 144*a*, gas hole middle part 144*b*, and gas hole lower part 144*c*. Although not shown in the drawing, each lift pin hole is a hole made up of the continuous lift pin hole upper part, lift pin hole middle part, and lift pin hole lower part.

TCB is performed, for example, as follows. In other words, the laminated body is pressurized at a temperature lower than or equal to a solidus temperature of the metal bonding material (for example, higher than or equal to a temperature obtained by subtracting 20° C. from the solidus temperature and lower than or equal to the solidus temperature) to perform bonding, after that the temperature is returned to a room temperature. Thus, the metal bonding material becomes the metal bonding layer. An Al—Mg bonding material or an Al—Si—Mg bonding material may be used as the metal bonding material at this time. When, for example, TCB is performed by using an Al—Si—Mg bonding material, the laminated body is pressurized in a state of being heated under vacuum atmosphere. The metal bonding material with a thickness of about 100 μm is preferable.

Subsequently, the ceramic base 20 with the central part 22 and the outer peripheral part 24 is obtained by cutting the outer periphery of the ceramic sintered body 120 to form a step. The cooling base 30 with the flange 34 is obtained by cutting the outer periphery of the MMC block 130 to form a step. The electrically insulating tube 55 that allows insertion of the power supply terminal 54 is disposed in the terminal hole 51 from the bottom surface of the ceramic base 20 to the bottom surface of the cooling base 30. The side surface of the outer peripheral part 24 of the ceramic base 20, the periphery of the metal bonding layer 40, and the side surface of the cooling base 30 are subjected to thermal spraying by using ceramic powder to form the electrically insulating film 42 (FIG. 5G). The seal band 22*b* and the small projections 22*c* are formed by, for example, blasting. Thus, the wafer placement table 10 is obtained.

The cooling base 30 of FIG. 1 has been described as a single-piece product; however, as shown in FIG. 5G, the cooling base 30 may be configured such that two members are bonded by a metal bonding layer or may be configured such that three or more members are bonded by metal bonding layers.

Next, an example of the use of the wafer placement table 10 will be described with reference to FIG. 1. The wafer placement table 10 is fixed to the mounting plate 96 in the chamber 94 by the clamp member 70 as described above. A shower head 98 that discharges process gas from a large number of gas injection holes into the chamber 94 is disposed on the ceiling surface of the chamber 94.

A focus ring 78 is placed on the FR placement surface 24*a* of the wafer placement table 10, and a disk-shaped wafer W is placed on the wafer placement surface 22*a*. The focus ring 78 has a step along the inner periphery of an upper end part so as not to interfere with the wafer W. In this state, the wafer W is attracted to the wafer placement surface 22*a* by applying a direct current voltage of the wafer attraction direct current power supply 52 to the wafer attraction electrode 26. Then, the inside of the chamber 94 is set to a predetermined vacuum atmosphere (or reduced-pressure atmosphere), and an RF voltage from the RF power supply 62 is applied to the cooling base 30 while process gas is being supplied from the shower head 98. As a result, plasma is generated between the wafer W and the shower head 98. Then, the wafer W is subjected to CVD deposition or etching by using the plasma. As the wafer W is subjected to a plasma process, the focus ring 78 abrades; however, the focus ring 78 is thicker than the wafer W, replacement of the focus ring 78 is performed after processing a plurality of wafers W.

When a wafer W is processed with high-power plasma, it is necessary to efficiently cool the wafer W. In the wafer placement table 10, not a resin layer with a low thermal conductivity but the metal bonding layer 40 with a high thermal conductivity is used as the bonding layer between the ceramic base 20 and the cooling base 30. Therefore, performance to dissipate heat from a wafer W (heat dissipation performance) is high. Since a difference in thermal expansion between the ceramic base 20 and the cooling base 30 is small, a trouble is less likely to occur even when stress relaxation properties of the metal bonding layer 40 are low. Furthermore, since the parts 32*a* passing through the areas respectively around the holes in the refrigerant flow channel 32 are narrowed, the flow rate of refrigerant flowing through the parts 32*a* is higher than the flow rate of refrigerant flowing through the other parts, and heat exchange between the wafer W and refrigerant is promoted.

In the wafer placement table 10 of the above-described present embodiment, a heat exchange promoting portion (the narrowed part 32*a* in the refrigerant flow channel 32) that promotes heat exchange between refrigerant flowing through the refrigerant flow channel 32 and the wafer W placed on the wafer placement surface 22*a* is provided in the area around each of the holes (the terminal hole 51, the gas holes 44, and the lift pin holes 48). Generally, an area around just above such a hole in a wafer W tends to be a hot spot; however, the heat exchange promoting portion is provided in an area around such a hole in the present embodiment, so heat dissipation of the area around the hole is promoted. Therefore, it is possible to reduce occurrence of a hot spot in a wafer W.

Generally, areas respectively just above the terminal hole 51, the gas holes 44, and the lift pin holes 48 in a wafer W tend to be hot spots. Therefore, the significance of applying the heat exchange promoting portion (the narrowed part 32*a* in the refrigerant flow channel 32) to the area around each of these holes is high.

The present invention is not limited to the above-described embodiment and may be, of course, implemented in various modes within the technical scope of the present invention.

Figure 6:
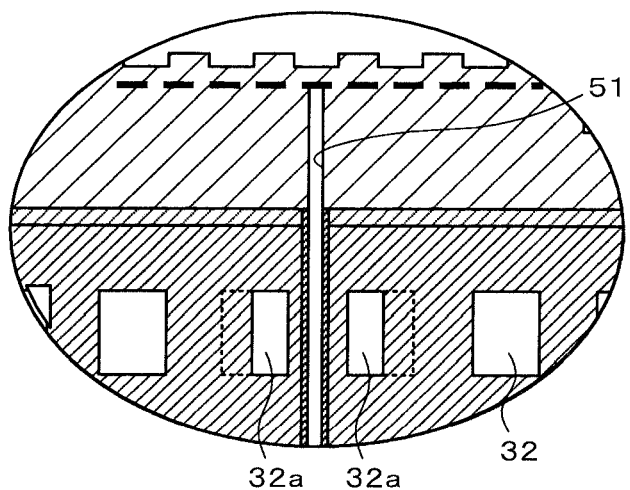
FIG. 6 is an enlarged sectional view showing a relevant part of another example of the refrigerant flow channel 32.

In the above-described embodiment, the narrowed part 32*a* is provided on one of parts of the refrigerant flow channel 32, respectively passing on both right and left sides of the terminal hole 51; however, the configuration is not limited. For example, as shown in the enlarged sectional view of FIG. 6, the narrowed part 32*a* may be provided on each of parts of the refrigerant flow channel 32, respectively passing on both right and left sides of the terminal hole 51. With this configuration, the area around the terminal hole 51 is more easily prevented from becoming a hot spot. A structure similar to this may also be adopted to parts of the refrigerant flow channel 32, respectively passing on both right and left sides of each of the gas holes 44 and the lift pin holes 48.

Figure 7:
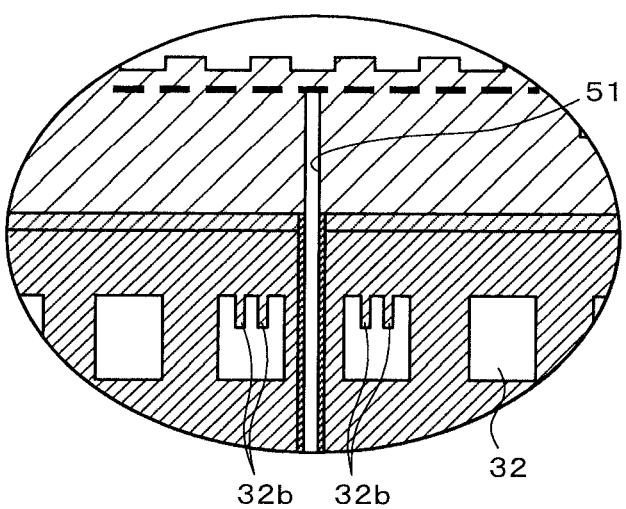
FIG. 7 is an enlarged sectional view showing a relevant part of another example of the refrigerant flow channel 32.

In the above-described embodiment, the part 32*a* where the refrigerant flow channel 32 is narrowed is provided as the heat exchange promoting portion in the refrigerant flow channel 32 passing through the area around the terminal hole 51; however, the configuration is not limited thereto. For example, as shown in the enlarged sectional view of FIG. 7, fins 32*b* serving as the heat exchange promoting portion may be provided on the inner surface of the refrigerant flow channel 32 passing through the area around the terminal hole 51. Refrigerant flowing through the part where the fins 32*b* are provided in the refrigerant flow channel 32 is more likely to be turbulent flow than refrigerant flowing through the part where no fin is provided in the refrigerant flow channel 32. Therefore, heat dissipation of the area around the terminal hole 51 is promoted. The number of the fins 32*b* and the length of each fin 32*b* may be set as needed according to a heat dissipation amount desired. A structure similar to this may also be adopted to the refrigerant flow channel 32 passing through the area around each of the gas holes 44 and the lift pin holes 48.

Figure 8:
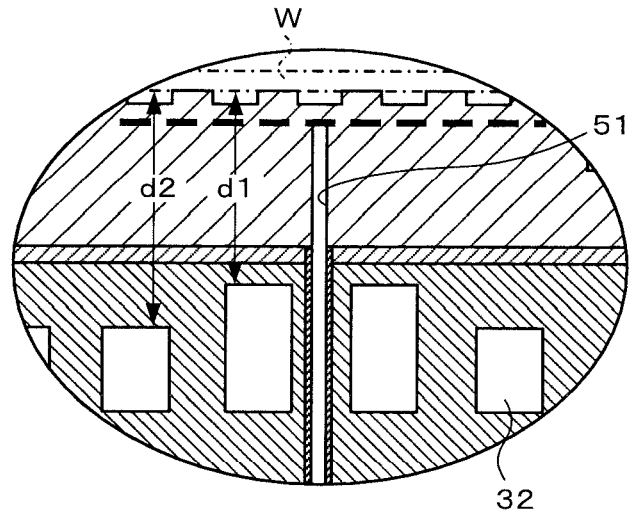
FIG. 8 is an enlarged sectional view showing a relevant part of another example of the refrigerant flow channel 32.

Alternatively, as shown in an enlarged sectional view of FIG. 8, a distance d1 from the wafer W to the ceiling surface of the refrigerant flow channel 32 in the area around the terminal hole 51 may be shorter than a distance d2 from the wafer W to the ceiling surface of the refrigerant flow channel 32 in the area outside the area around the terminal hole 51. The thermal resistance of refrigerant flowing through the part where the distance from the wafer W to the ceiling surface of the refrigerant flow channel 32 (part with the distance d1) is short is smaller than the thermal resistance of refrigerant flowing through the part where the distance from the wafer W to the ceiling surface of the refrigerant flow channel 32 is not short (part with the distance d2). Therefore, heat dissipation of the area around the terminal hole 51 is promoted. In FIG. 8, the length of the refrigerant flow channel 32 in the up and down direction is longer in the part where the distance from the wafer W to the ceiling surface of the refrigerant flow channel 32 is short than in the other part; however, it may be the same as the length of the other part. A structure similar to this may also be adopted to the area around each of the gas holes 44 and the lift pin holes 48.

Figure 9:
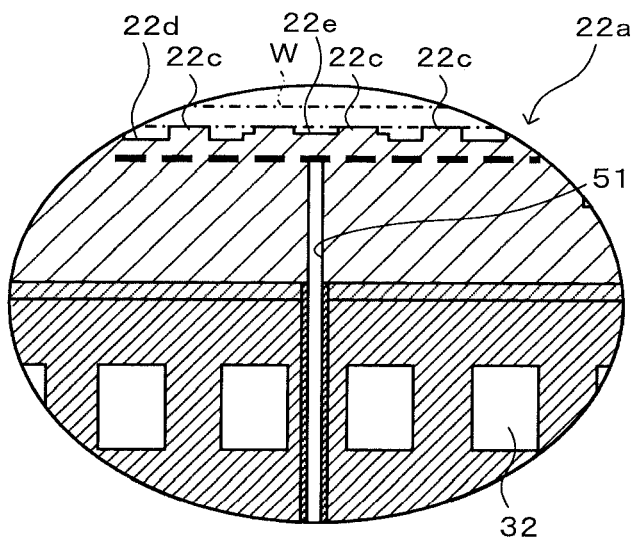
Figure 10:
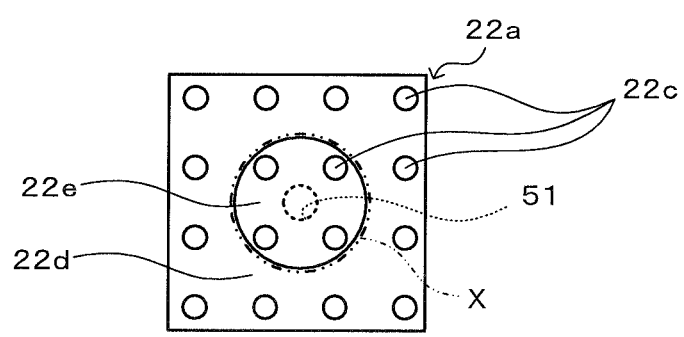
FIG. 10 is a plan view showing a relevant part of the wafer placement surface 22a of FIG. 9.

Alternatively, as shown in an enlarged sectional view of FIG. 9 and a plan view of FIG. 10, a reference surface 22*e* formed in an area X around the terminal hole 51 in the wafer placement surface 22*a* may be raised as compared to a reference surface 22*d* formed in an area outside the area X around the terminal hole 51. With this configuration, the thickness of an air gap between the reference surface 22*e* and the wafer W supported on the small projections 22*c* is thinner than the thickness of an air gap between the wafer W and the reference surface 22*d*. Since the ratio of ceramics in the thickness direction in the area X around the terminal hole 51, in which the raised reference surface 22*e* is formed in the wafer placement surface 22*a*, is higher than the ratio of ceramics in the thickness direction in the area outside the area X around the terminal hole 51 (the area in which the reference surface 22*d* is formed), heat exchange between the wafer W and refrigerant is promoted, and heat dissipation is promoted. A structure similar to this may also be adopted to the area around each of the gas holes 44 and the lift pin holes 48.

Figure 11A:
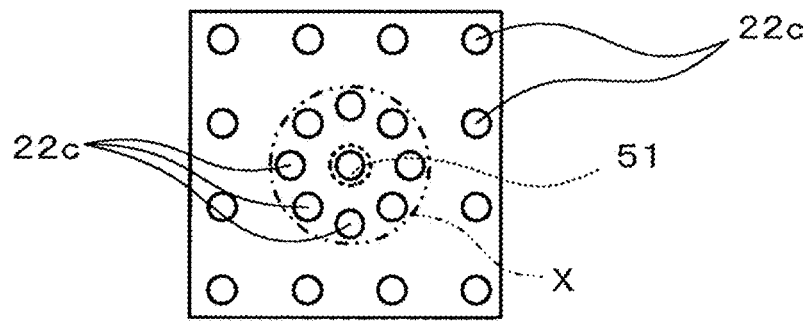
Figure 11B:
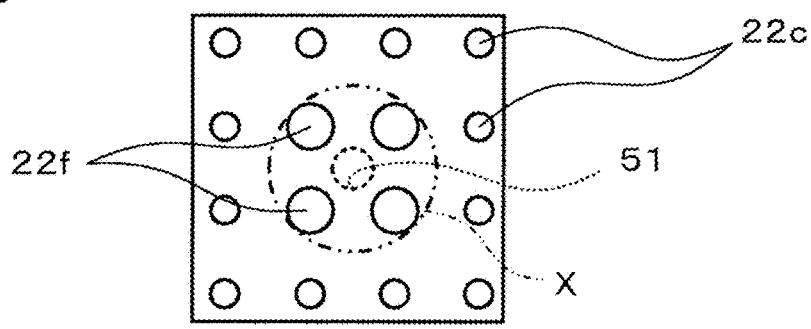
Figure 11C:
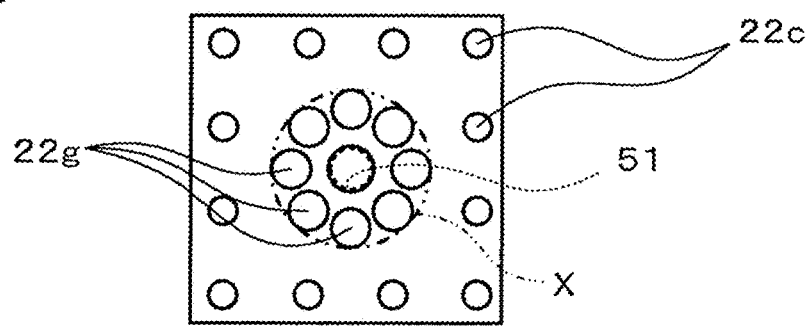
Figure 11D:
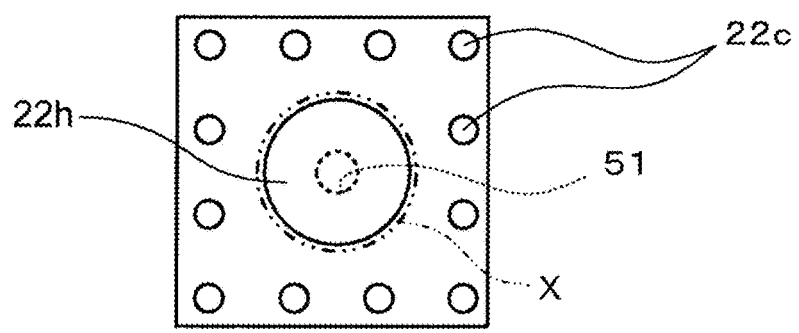

Alternatively, as shown in FIGS. 11A to 11D, the coverage factor of small projections in the area X around the terminal hole 51 may be higher than the coverage factor of small projections in the area outside the area X around the terminal hole 51. FIGS. 11A to 11D are plan views each showing a relevant part (which corresponds to a part surrounded by the alternate long and short dashes line in FIG. 2) of another example of the wafer placement surface 22*a*. The coverage factor of small projections is the ratio of the total area of top faces of small projections to a unit area. For example, in FIG. 11A, the density of the small projections 22*c* disposed in the area X around the terminal hole 51 is higher than the density of the small projections 22*c* disposed in the area outside the area X around the terminal hole 51. In FIG. 11B, in the area X around the terminal hole 51, small projections 22*f* each having a top face with a greater area than that of each of the small projections 22*c* are disposed. In FIG. 11C, small projections 22*g* each having a top face with a greater area than that of each of the small projections 22*c* are disposed more densely in the area X around the terminal hole 51 than in the area outside the area X around the terminal hole 51. In FIG. 11D, a single small projection 22*h* having an area that substantially covers the area X is disposed in the area X around the terminal hole 51. In any case, the coverage factor of small projections in the area X around the terminal hole 51 is higher than the coverage factor of small projections in the area outside the area X around the terminal hole 51. The small projections are made of ceramics. Ceramics are higher in thermal conductivity than an air gap. The ratio of ceramics in a plane direction in a part where the coverage factor of small projections is high is higher than the ratio of ceramics in the plane direction in a part where the coverage factor of small projections is not high, so heat exchange between a wafer and refrigerant is promoted, and heat dissipation is promoted. A structure similar to this may also be adopted to the area around each of the gas holes 44 and the lift pin holes 48.

In the above-described embodiment, the heat exchange promoting portion is provided in the area around each of the terminal hole 51, the gas holes 44, and the lift pin holes 48; however, the configuration is not limited thereto. For example, the heat exchange promoting portion may be provided in the area around one or some of these holes (for example, an area that particularly tends to be a hot spot).

In the above-described embodiment, in the part 32*a* passing through the area around the hole, the width of the refrigerant flow channel 32 is narrowed; however, the configuration is not limited thereto. For example, in the part 32*a* passing through the area around the hole, the length of the refrigerant flow channel 32 in the up and down direction may be reduced.

In the above-described embodiment, the cooling base 30 is made of an MMC; however, the configuration is not limited thereto. The cooling base 30 may be made of metal (for example, aluminum, titanium, molybdenum, tungsten, and alloys of them).

In the above-described embodiment, the ceramic base 20 and the cooling base 30 are bonded via the metal bonding layer 40 having a high thermal conductivity and high advantageous effects of the invention; however, the configuration is not limited thereto. For example, instead of the metal bonding layer 40, a resin bonding layer may be used.

In the above-described embodiment, the shape of the refrigerant flow channel 32 in plan view is a spiral shape; however, the configuration is not limited thereto. For example, the shape of the refrigerant flow channel 32 in plan view may be a zigzag shape. Specifically, an inlet and an outlet may be provided at two point-symmetric points around the outer periphery with respect to the center of the cooling base 30 in plan view, and the refrigerant flow channel 32 may be formed so as to be zigzag in a one-stroke pattern from the inlet to the outlet.

In the above-described embodiment, the wafer attraction electrode 26 is incorporated in the central part 22 of the ceramic base 20. Instead of or in addition to this, an RF electrode for generating plasma may be incorporated, and a heater electrode (resistance heating element) may be incorporated. A focus ring (FR) attraction electrode may be incorporated in the outer peripheral part 24 of the ceramic base 20, and an RF electrode or a heater electrode may be incorporated.

In the above-described embodiment, the ceramic sintered body 120 of FIG. 5A is made by firing a ceramic powder molded body by hot pressing. The molded body at that time may be made by laminating a plurality of molded tapes, or may be made by mold casting, or may be made by compacting ceramic powder.

The present application claims priority from Japanese Patent Application No. 2021-168603, filed on Oct. 14, 2021, the entire contents of which are incorporated herein by reference.

What is claimed is:

1. A wafer placement table comprising:
a ceramic base having a wafer placement surface on its top surface where a wafer is able to be placed and incorporating an electrode;
a cooling base bonded to a bottom surface of the ceramic base and having a refrigerant flow channel;
a plurality of holes extending through the cooling base in an up and down direction;
a heat exchange promoting portion that is provided in an area around at least one of the plurality of holes and that promotes heat exchange between refrigerant flowing through the refrigerant flow channel and a wafer placed on the wafer placement surface; and
a plurality of small projections that is provided on a reference surface of the wafer placement surface and that supports a bottom surface of a wafer with top faces, wherein
the top faces of the plurality of small projections are in the same plane, and
the reference surface in the heat exchange promoting portion is raised as compared to the area outside the area around at least one of the plurality of holes.

2. The wafer placement table according to claim 1, wherein
the refrigerant flow channel in the heat exchange promoting portion is narrower than the refrigerant flow channel in an area outside the area around at least one of the plurality of holes.

3. The wafer placement table according to claim 2, wherein
when the refrigerant flow channel is viewed in plan, the width of the refrigerant flow channel in the heat exchange promoting portion is narrower than the width of the refrigerant flow channel in the area outside the area around at least one of the plurality of holes.

4. The wafer placement table according to claim 1, wherein
in the heat exchange promoting portion, a fin is provided on an inner surface of the refrigerant flow channel.

5. The wafer placement table according to claim 1, wherein
a distance from the wafer to a ceiling surface of the refrigerant flow channel in the heat exchange promoting portion is shorter than the distance in an area outside the area around at least one of the plurality of holes.

6. The wafer placement table according to claim 1, wherein
at least one of the plurality of holes is at least one selected from the group of a power supply member insertion hole that is provided to extend downward from the electrode in the wafer placement table and through which a power supply member that supplies electric power to the electrode is inserted, a lift pin hole that extends through the wafer placement table in the up and down direction and through which a lift pin is inserted, and a gas hole that extends through the wafer placement table in the up and down direction and through which gas is supplied to the wafer placement surface.

* * * * *